United States Patent
Ranganathan et al.

(10) Patent No.: US 6,825,563 B1
(45) Date of Patent: Nov. 30, 2004

(54) SLOTTED BONDING PAD

(75) Inventors: Ramaswamy Ranganathan, Saratoga, CA (US); Maurice Othieno, Union City, CA (US); Qwai H. Low, Cupertino, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/683,101

(22) Filed: Oct. 9, 2003

(51) Int. Cl.[7] .............................................. H01L 23/48
(52) U.S. Cl. ...................... 257/758; 257/773; 257/774; 257/786; 257/781
(58) Field of Search ...................... 257/758, 773–774, 257/786, 781

(56) References Cited

U.S. PATENT DOCUMENTS 5,700,735 A * 12/1997 Shiue et al. ................ 438/612

* cited by examiner

Primary Examiner—Luan Thai
(74) Attorney, Agent, or Firm—Luedeka, Neely & Graham, P.C.

(57) ABSTRACT

A bonding pad structure having an electrically conductive capping layer. An electrically conductive first supporting layer having major orthogonal sides is disposed under the electrically conductive capping layer. The electrically conductive first supporting layer is configured as a sheet having slotted voids in a first direction. An electrically conductive second supporting layer having major orthogonal sides is disposed under the electrically conductive first supporting layer. The electrically conductive second supporting layer is configured as a sheet having slotted voids in a second direction. The first direction and the second direction are associated one with another by being disposed at a positive value and a negative value of an angle, where the angle is neither zero nor ninety degrees with respect to the major orthogonal sides of the electrically conductive first supporting layer and the electrically conductive second supporting layer.

20 Claims, 2 Drawing Sheets

SLOTTED BONDING PAD

FIELD

This invention relates to the field of integrated circuit fabrication. More particularly, this invention relates to new structures and fabrication methods for integrated circuits that use advanced materials and designs.

BACKGROUND

As integrated circuits have become increasingly smaller, electrically conductive structures within the integrated circuits are placed increasingly closer together. This situation tends to enhance the inherent problem of parasitic capacitance between adjacent electrically conductive structures. Thus, new electrically insulating materials have been devised for use between electrically conductive structures, to reduce such capacitance problems. The new electrically insulating materials typically have lower dielectric constants, and thus are generally referred to as low k materials. While low k materials help to resolve the capacitance problems described above, they unfortunately tend to introduce new challenges.

Low k materials are typically filled with small voids that help reduce the material's effective dielectric constant. Thus, there is less of the material itself within a given volume, which tends to reduce the structural strength of the material. The resulting porous and brittle nature of such low k materials presents new challenges in both the fabrication and packaging processes. Unless special precautions are taken, the robustness and reliability of an integrated circuit that is fabricated with low k materials may be reduced from that of an integrated circuit that is fabricated with traditional materials, because low k materials differ from traditional materials in properties such as thermal coefficient of expansion, moisture absorption, adhesion to adjacent layers, mechanical strength, and thermal conductivity.

Concerning the problem of thermal coefficient of expansion, when adjacent layers having different thermal coefficients of expansion are heated and cooled, such as occurs during the normal operation of an integrated circuit, the layers tend to expand and contract at different rates and to different degrees. These forces induce strains in the adjacent and proximal layers. Low k materials tend to have thermal coefficients of expansion that are sufficiently different from those of the other materials used to fabricate integrated circuits that such strains create problems, which may be both physical and electrical, in the integrated circuit.

As to the problem of moisture absorption, the porosity of low k materials makes them susceptible to absorbing the moisture that typically tends to diffuse into the packaged integrated circuit. As the low k material absorbs such moisture, the properties of the low k material changes. For example, the dielectric constant of the material changes, because the voids tend to fill with water or water vapor. The moisture in the voids may rapidly expand during subsequent heating operations such as baking or solder ball reflow, causing the layers of the integrated circuit to burst apart, resulting in dramatic device failure. The moisture absorbed by the low k material also tends to cause other problems, some of which are described in more detail below.

Integrated circuits containing low k materials are inherently more prone to delamination, either between the various layers of the integrated circuit itself, or between the integrated circuit and packaging materials, such as underfill and mold compound, or other materials which are in intimate contact with the integrated circuit. There are several probable causes for such delamination, including a reduction in the adhesion of a low k layer due to absorption of moisture, as described above. In addition, because the low k material tends to be very porous by nature, there is physically less material available to form adhesive bonds with adjacent layers. Further, the strains induced by differing thermal coefficients of expansion also tend to shear the low k layer from adjacent layers, which again tends to enhance the occurrence of delamination.

As to mechanical strength, low k materials are typically more brittle and have a lower breaking point than other materials. One reason for this is, again, the porosity of the low k material, where a significant percentage of its physical volume is filled with voids. Thus, integrated circuits containing low k materials are inherently more prone to breaking or cracking during processes where physical contact is made with the integrated circuit surface, such as wire bonding and electrical probing, or processes that cause bending stresses such as mold curing, underfill curing, solder ball reflow, or temperature cycling.

Finally, because of their porosity and other properties, low k materials tend to be very poor thermal conductors, typically much less than half a watt per meter-Kelvin (W/mK). This contrasts significantly with the thermal conductivity of traditional integrated circuit and packaging materials such as silicon (60–90 W/mK), copper (380–390 W/mK), mold compound (0.7–2 W/mK), or die attach material (2–4 W/mK). Thus, the thermal energy created during the normal operation of the integrated circuit tends to not be dissipated well by low k materials. Therefore, thermal energy tends to build up within the integrated circuit, and is expressed as localized areas of increased temperature, or hot spots.

One example of where the structural weakness of low k materials has been especially detrimental is when they are used as dielectrics under bonding pad structures. When a wire bonding operation is performed, a relatively high degree of force is applied to the bonding pad, which force tends to be transferred down through the bonding pad structure and into underlying structures. When the bonding pad overlies electrical structures, such as input/output cells, the low k materials used for the dielectric layers in such electrical structures tend to crack or delaminate from adjacent layers under the load of the transferred force. This problem could be resolved by moving the input/output cells out from under the bonding pads, but this would tend to increase the size of the integrated circuit, which is not desirable.

There is a need, therefore, for new structures, processes, and materials for use in integrated circuit fabrication, which help to alleviate one or more of the challenges that are enhanced by the use of low k materials.

SUMMARY

The above and other needs are met by a bonding pad structure having an electrically conductive capping layer. An electrically conductive first supporting layer having major orthogonal sides is disposed under the electrically conductive capping layer. The electrically conductive first supporting layer is configured as a sheet having slotted voids in a first direction. An electrically conductive second supporting layer having major orthogonal sides is disposed under the electrically conductive first supporting layer. The electrically conductive second supporting layer is configured as a sheet having slotted voids in a second direction. The first direction and the second direction are associated one with another by being disposed at a positive value and a negative value of an angle with respect to the major orthogonal sides of the electrically conductive first supporting layer and the electrically conductive second supporting layer, where the angle is neither zero nor ninety degrees.

In this manner, the first and second supporting layers provide structural support for the layers below the bonding pad structure, such as electrical circuitry like input/output cells. With the supporting layers configured as described herein, pressure that is applied to the bonding pad structure, such as during a wire bonding operation, is absorbed or redirected so that the more delicate structures underneath, including low k dielectric layers, are protected from the force applied during the bonding operation. In this manner, the delicate underlying structures do not suffer physical damage, such as cracks and delamination.

In various preferred embodiments, the bonding pad structure includes an electrically nonconductive layer disposed between the electrically conductive first supporting layer and the electrically conductive second supporting layer. The electrically nonconductive layer is preferably either a low k layer or a silicon oxide layer. Preferably, the electrically conductive capping layer is formed of aluminum. The electrically conductive first supporting layer is preferably formed of copper. Preferably, the electrically conductive second supporting layer is formed of copper. The angle is preferably forty-five degrees.

Also described is an integrated circuit having the bonding pad structure described herein, and an input/output cell disposed directly underneath and electrically connected to the bonding pad structure. In another embodiment, electrically conductive third layers are disposed under the electrically conductive second supporting layer, and low k layers electrically insulate the electrically conductive third layers from one another and from the electrically conductive second supporting layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
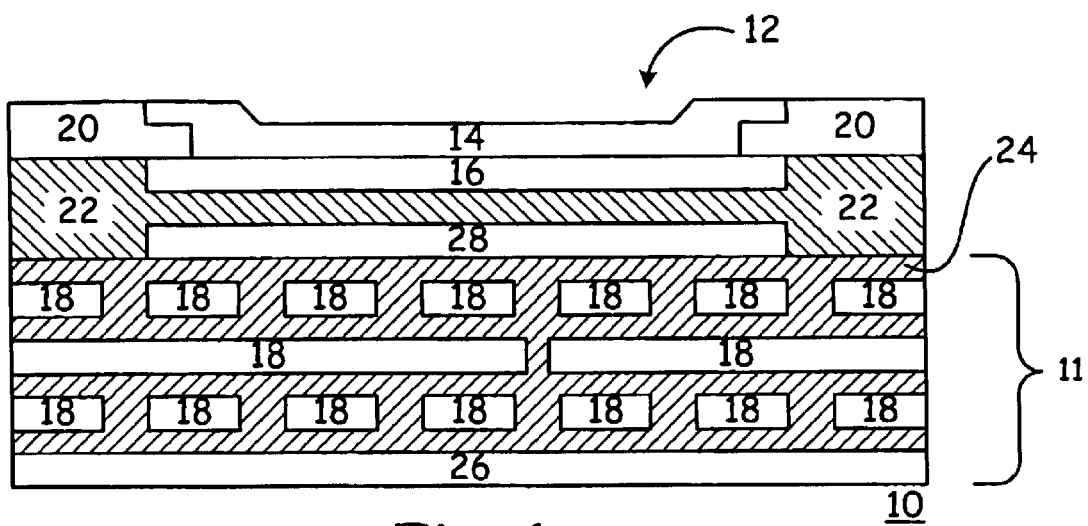
FIG. 1 is a cross sectional view of a portion of an integrated circuit, depicting a bonding pad structure according to the present invention, which overlies additional electrical circuitry.

With reference now to FIG. 1, there is shown a cross sectional view of a portion of an integrated circuit 10, depicting a bonding pad structure 12 according to the present invention, which overlies additional electrical circuitry 11. The structures as depicted are preferably formed on a substrate 26. The substrate 26 most preferably includes a semiconductor wafer, such as one formed of one or more of silicon, germanium, or a III-V compound such as gallium arsenide. The substrate 26 may also include additional layers and structures, which are not individually depicted in FIG. 1 so as to not unnecessarily encumber the drawing with the minute details of elements that are not essential for an understanding of the invention.

The bonding pad structure 12 preferably includes a capping layer 14, which is formed of an electrically conductive material such as a metal or a metal alloy, and which is most preferably aluminum. An electrically nonconducting layer, such as a passivation layer 20, preferably surrounds the electrically conductive capping layer 14. The capping layer 14 is that part of the bonding pad structure 12 to which a wire is bonded during a wire bonding operation, so as to make an electrical connection with the integrated circuit 10.

A first electrically conductive supporting layer 16 is disposed below the capping layer 14. The first supporting layer 16 is also preferably formed of a metal or a metal alloy, and is most preferably formed of copper. In this manner, the first supporting layer 16 is formed of a material that is sufficient to substantially absorb the forces applied to the bonding pad structure 12 during a wire bonding operation, and protect the underlying circuitry from such forces, in a manner as more fully described hereafter.

Figure 2:
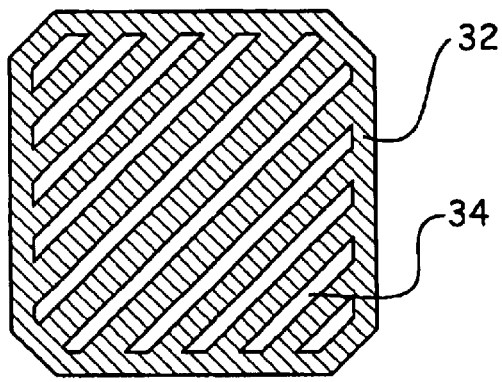
FIG. 2 is a top plan view of a sheet having slotted voids in a first direction with a first positive angle, as a configuration for an electrically conductive structure.
Figure 3:
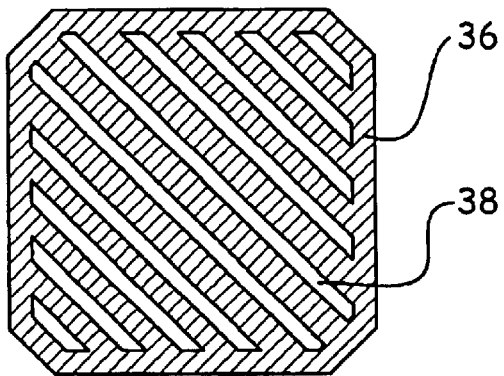
FIG. 3 is a top plan view of a sheet having slotted voids in a second direction with a first negative angle, as a configuration for an electrically conductive structure.

The first supporting layer 16 is preferably configured as a sheet 32 having slotted voids 34 oriented in a first direction, as depicted in FIG. 2, or as a sheet 36 having slotted voids 38 oriented in a second direction, as depicted in FIG. 3. It is appreciated that the term "voids" as used herein refers to relatively large, intentionally made voids, and does not refer to very small pinholes or other such voids that may incidentally form in the material of the relevant layer as it is being fabricated.

An electrically conductive second supporting layer 28 preferably underlies the first supporting layer 16. The second supporting layer 28 is also preferably formed of a metal or a metal alloy, and is most preferably copper. The second supporting layer 28 is, in various embodiments, preferably configured as one of a sheet 32 having slotted voids 34 oriented in a first direction as depicted in FIG. 2, a sheet 36 having slotted voids 38 oriented in a second direction as depicted in FIG. 3.

Both the first supporting layer 16 and the second supporting layer 28 are preferably formed as substantially rectangular pads, and are most preferably substantially square. By "substantially," it is meant that the corners of the first supporting layer 16 and the second supporting layer 28 may be somewhat angled, rounded, or otherwise not perfectly square, but the shape of the first supporting layer 16 and the second supporting layer 28 is predominantly as described. Thus, the first supporting layer 16 and the second supporting layer 28 each have four major orthogonal sides.

Preferably, there is a relationship between the slotted voids of the first supporting layer 16 and the second supporting layer 28, in that the slotted voids are disposed at an angle from the major orthogonal sides of the first supporting layer 16 and the second supporting layer 28. Most preferably, the angle at which the slotted voids are disposed is not zero degrees or ninety degrees with respect to any of the major orthogonal sides of the first supporting layer 16 and the second supporting layer 28. Further, the slotted voids of one of the first supporting layer 16 and the second supporting layer 28 are preferably disposed at a positive value of a given angle with respect to the major orthogonal sides of the first supporting layer 16 and the second supporting layer 28, and the slotted voids of the other of the first supporting layer 16 and the second supporting layer 28 are preferably disposed at a negative value of the same given angle with respect to the first supporting layer 16 and the second supporting layer 28.

Figure 4:
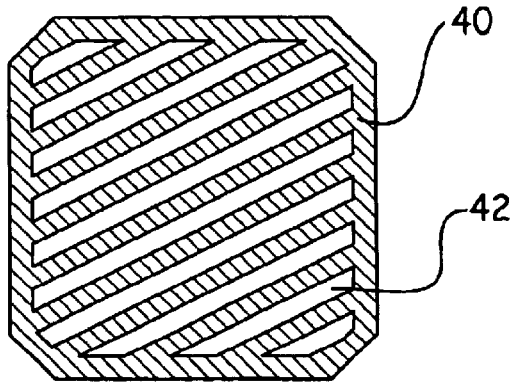
FIG. 4 is a top plan view of a sheet having slotted voids in a first direction with a second positive angle, as a configuration for an electrically conductive structure.
Figure 5:
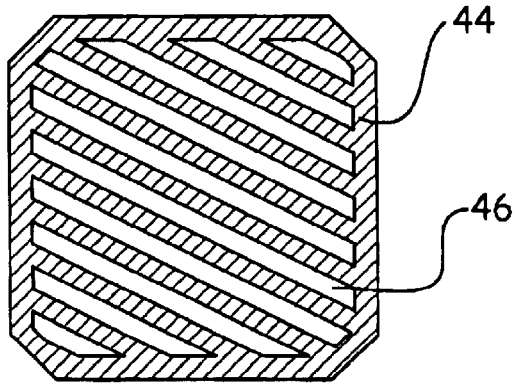
FIG. 5 is a top plan view of a sheet having slotted voids in a second direction with a second negative angle, as a configuration for an electrically conductive structure.

For example, the slotted voids may be disposed at a positive and negative forty-five degree angle, as depicted in FIGS. 2 and 3. Alternately, the slotted voids may be disposed a positive and negative thirty degree angle, as depicted in FIGS. 4 and 5. It is appreciated that other angles may also be used, but the two angles depicted are sufficient to convey this aspect of the invention. It is also appreciated that either one of the first supporting layer 16 and the second supporting layer 28 may have slotted voids that are disposed at the positive angle, and either one of the first supporting layer 16 and the second supporting layer 28 may have slotted voids that are disposed at the negative angle, so long as both the first supporting layer 16 and the second supporting layer 28 do not both have slotted voids that are disposed at the same positive angle or the same negative angle.

In this manner, the first and second supporting layers 16 and 28 are sufficient to substantially absorb the forces applied to the bonding pad structure 12 during a wire bonding operation, and protect the underlying circuitry, such as the circuitry 11, from such forces. The first and second supporting layers 16 and 28 are preferably separated by an intervening layer 22 of a an electrically nonconductive material, which may be either a traditional dielectric such as a silicon oxide, or a low k material.

The circuitry 11 disposed below the bonding pad structure 12 is most preferably one or more input/output cell. In this manner, the bonding pad structure 12 overlies the input/output cell circuitry 11, and thus does not take additional surface area of the integrated circuit 10. This tends to reduce the size of the integrated circuit 10, which also tends to reduced the cost of the integrated circuit 10. The circuitry 11 below the bonding pad structure 12 is preferably formed of electrically conductive lines 18, which are most preferably formed of copper, and which are electrically insulated one from another and also from the second supporting layer 28 by a dielectric material 24, which is most preferably a low k material. Additional structures for the input/output cells are in the substrate 26, which as described above, preferably includes more layers and structures as depicted than just a semiconducting wafer.

Thus, bonding pad structures 12 according to various embodiments of the present invention allow for the bonding pad structures 12 to be placed over active circuitry 11, such as input/output cells, and for that active circuitry 11 to include fragile materials such as low k layers. Because the bonding pad structure 12 absorbs and redirects the forces applied during a wire bonding operation, the underlying circuitry 11 is not damaged, such as by cracking or delamination. Thus, the bonding pad structures 12 according to the present invention allow the integrated circuit 10 to be formed with the bonding pad structures 12 overlying input/output cells, which generally reduces both the size, and therefore the cost, or the integrated circuit 10.

Figure 6:
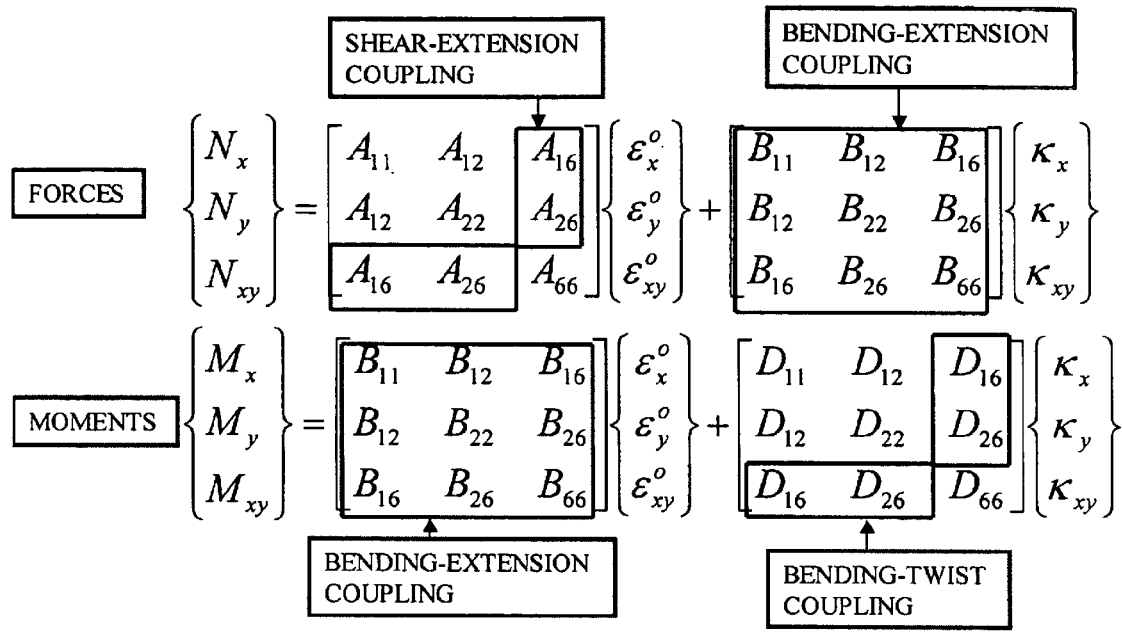
FIG. 6 depicts stiffness terms in force and moment resultants for orthotropic materials.
Figure 7:
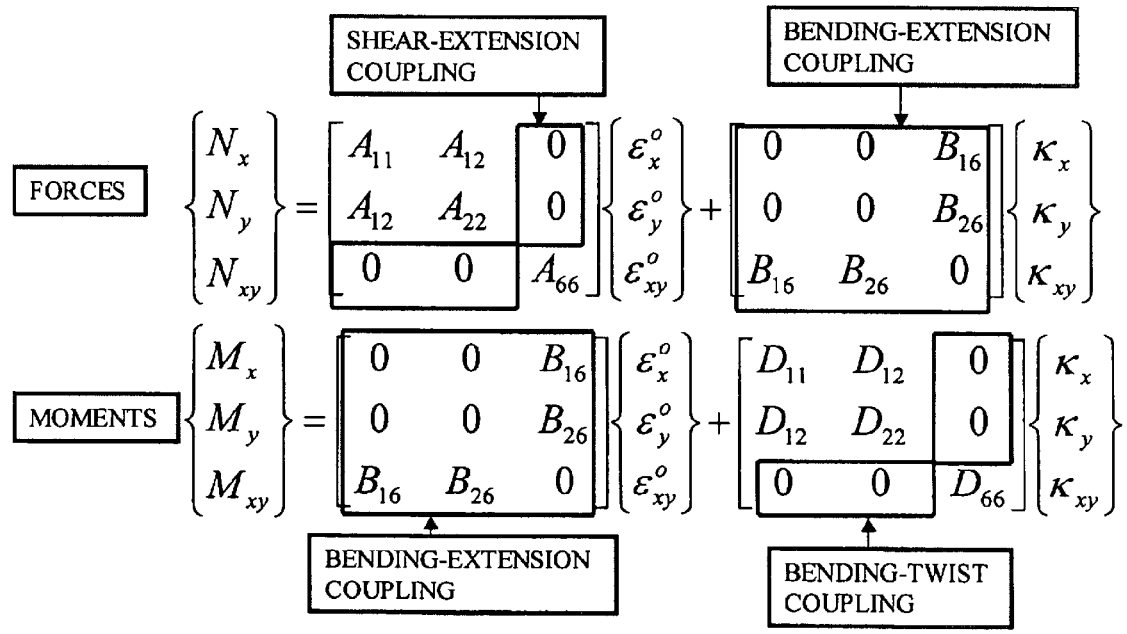
FIG. 7 depicts the physical significance of stiffness terms in force and moment resultants for an angle-ply stack-up according to the present invention.

Without being bound by theory, FIGS. 6 and 7 provide some understanding for the cooperative operation of the first supporting layer 16 and the second supporting layer 28. FIG. 6 provides the stiffness terms for any material or group materials that exhibit dissimilar mechanical properties in its plane of symmetry upon mechanical (or thermal) loading. In FIG. 6, $A_{ij}$ represent the extensional stiffness terms, $B_{ij}$ represents the coupling between extension stiffness and bending terms, and $D_{ij}$ represents the bending-twist terms. From FIG. 6, it is noted that for an orthotropic material that is designed without any stack-up considerations, the three matrices will be fully populated. This physically means that the materials will experience higher stresses (normal and shear ($N_j$) and bending ($M_j$)). However, by careful consideration of the stack-up between the first supporting layer 16 and the second supporting layer 28 as described herein, the stresses experienced with the materials can be greatly reduced. FIG. 7 provides the stiffness terms of an angle-ply stack-up as described herein. It is noted here that the bending-extension and the bending-twist coupling terms are reduced to zero, while the stresses due to the bending-extension coupling are also greatly reduced.

Physically, this means that the chance for metal delamination (shearing stresses) is reduced. It also means that the chance for metal peel-off (twisting stresses) is reduced. The higher total stiffness achieved due to the stack-up also reduces the chance of cracking in the dielectric layer 22 between the first supporting layer 16 and the second supporting layer 28.

It is appreciated that the angle-ply stack-up as described herein is not limited to only the first supporting layer 16 and the second supporting layer 28, which as depicted are the redistribution layers or the +1 layers of metal.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A bonding pad structure, comprising:
   an electrically conductive capping layer,
   an electrically conductive first supporting layer having major orthogonal sides and disposed under the electrically conductive capping layer, the electrically conductive first supporting layer configured as a sheet having slotted voids in a first direction, and
   an electrically conductive second supporting layer having major orthogonal sides and disposed under the electrically conductive first supporting layer, the electrically conductive second supporting layer configured as a sheet having slotted voids in a second direction,
   where the first direction and the second direction are associated one with another by being disposed at a positive value and a negative value of an angle with respect to the major orthogonal sides of the electrically conductive first supporting layer and the electrically conductive second supporting layer, where the angle is neither zero nor ninety degrees.

2. The bonding pad structure of claim 1, further comprising an electrically nonconductive layer disposed between the electrically conductive first supporting layer and the electrically conductive second supporting layer.

3. The bonding pad structure of claim 1, further comprising a low k layer disposed between the electrically conductive first supporting layer and the electrically conductive second supporting layer.

4. The bonding pad structure of claim 1, further comprising a silicon oxide layer disposed between the electrically conductive first supporting layer and the electrically conductive second supporting layer.

5. The bonding pad structure of claim 1, wherein the electrically conductive capping layer is formed of aluminum.

6. The bonding pad structure of claim 1, wherein the electrically conductive first supporting layer is formed of copper.

7. The bonding pad structure of claim 1, wherein the electrically conductive second supporting layer is formed of copper.

8. The bonding pad structure of claim 1, wherein the angle is forty-five degrees.

9. The bonding pad structure of claim 1, wherein the first direction and the second direction are disposed at right angles one to another.

10. The bonding pad structure of claim 1, further comprising an input/output cell disposed directly underneath and electrically connected to the bonding pad structure.

11. The bonding pad structure of claim 1, further comprising:
   electrically conductive third layers disposed under the electrically conductive second supporting layer, and
   low k layers electrically insulating the electrically conductive third layers from one another and from the electrically conductive second supporting layer.

12. An integrated circuit having the bonding pad structure of claim 1.

13. In an integrated circuit, the improvement comprising a bonding pad structure including:
   an electrically conductive capping layer,
   an electrically conductive first supporting layer having major orthogonal sides and disposed under the electrically conductive capping layer, the electrically conductive first supporting layer configured as a sheet having slotted voids in a first direction, and
   an electrically conductive second supporting layer having major orthogonal sides and disposed under the electrically conductive first supporting layer, the electrically conductive second supporting layer configured as a sheet having slotted voids in a second direction,
   where the first direction and the second direction are associated one with another by being disposed at a positive forty-five degrees and a negative forty-five degrees with respect to the major orthogonal sides of the electrically conductive first supporting layer and the electrically conductive second supporting layer.

14. The integrated circuit of claim 13, further comprising an electrically nonconductive layer disposed between the electrically conductive first supporting layer and the electrically conductive second supporting layer.

15. The integrated circuit of claim 13, further comprising a low k layer disposed between the electrically conductive first supporting layer and the electrically conductive second supporting layer.

16. The integrated circuit of claim 13, further comprising a silicon oxide layer disposed between the electrically conductive first supporting layer and the electrically conductive second supporting layer.

17. The integrated circuit of claim 13, wherein the electrically conductive capping layer is formed of aluminum, and the electrically conductive first supporting layer and the electrically conductive supporting layer are formed of copper.

18. The integrated circuit of claim 13, further comprising an input/output cell disposed directly underneath and electrically connected to the bonding pad structure.

19. The integrated circuit of claim 13, further comprising:
   electrically conductive third layers disposed under the electrically conductive second supporting layer, and
   low k layers electrically insulating the electrically conductive third layers from one another and from the electrically conductive second supporting layer.

20. In an integrated circuit, the improvement comprising a bonding pad structure including:
   an electrically conductive capping layer,
   an electrically conductive first supporting layer having major orthogonal sides and disposed under the electrically conductive capping layer, the electrically conductive first supporting layer configured as a sheet having slotted voids in a first direction,
   an electrically conductive second supporting layer having major orthogonal sides and disposed under the electrically conductive first supporting layer, the electrically conductive second supporting layer configured as a sheet having slotted voids in a second direction,
   a low k layer disposed between the electrically conductive first supporting layer and the electrically conductive second supporting layer, and
   an input/output cell disposed directly underneath and electrically connected to the bonding pad structure,
   where the first direction and the second direction are associated one with another by being disposed at a positive forty-five degrees and a negative forty-five degrees with respect to the major orthogonal sides of the electrically conductive first supporting layer and the electrically conductive second supporting layer.

* * * * *